(12) United States Patent
Yearous et al.

(10) Patent No.: US 7,514,276 B1
(45) Date of Patent: Apr. 7, 2009

(54) ALIGNING STACKED CHIPS USING RESISTANCE ASSISTANCE

(75) Inventors: Corey Elizabeth Yearous, Rochester, MN (US); Phil Christopher Paone, Rochester, MN (US); Kelly Lynn Williams, Rochester, MN (US); David Paul Paulsen, Rochester, MN (US); Gregory John Uhlmann, Rochester, MN (US); John Edward Sheets, II, Zumbrota, MN (US); Karl Robert Ericson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/190,395

(22) Filed: Aug. 12, 2008

(51) Int. Cl.
*H01L 21/20* (2006.01)

(52) U.S. Cl. .......................... 438/15; 438/14; 438/17; 438/18; 438/108; 438/126; 257/E21.511; 257/E21.606; 257/E21.705; 257/E23.004; 257/E23.019

(58) Field of Classification Search .................. 438/5, 438/10, 11, 14, 15, 17, 18, 108–126; 257/E21.511, 257/606, 715, E23.004, 19, 61, 65, 66, 67, 257/124

See application file for complete search history.

(56) References Cited

U.S. PATENT DOCUMENTS

| | | | | |
|---|---|---|---|---|
| 3,760,384 A | * | 9/1973 | Krolikowski et al. | 365/72 |
| 4,237,607 A | * | 12/1980 | Ohno | 29/840 |
| 4,862,322 A | * | 8/1989 | Bickford et al. | 361/718 |
| 5,148,266 A | * | 9/1992 | Khandros et al. | 257/773 |
| 5,207,585 A | * | 5/1993 | Byrnes et al. | 439/66 |
| 5,685,885 A | * | 11/1997 | Khandros et al. | 29/841 |
| 5,786,979 A | * | 7/1998 | Douglass | 361/328 |
| 6,008,536 A | | 12/1999 | Mertol | |
| 6,373,131 B1 | | 4/2002 | Karnezos | |

* cited by examiner

*Primary Examiner*—Michael S Lebentritt
(74) *Attorney, Agent, or Firm*—The Law Firm of Andrea Hence Evans, LLC

(57) ABSTRACT

The present invention relates to a method of aligning stacked chips wherein the apparatus and method utilize bumps in the form of exposed metal lines on a first chip. The present invention further relates to taking a resistance measurement to determine a quality of alignment wherein the resistance measurement indicates a direction in which the first chip and the second chip are misaligned.

1 Claim, 3 Drawing Sheets

ALIGNING STACKED CHIPS USING RESISTANCE ASSISTANCE

CROSS REFERENCE TO RELATED APPLICATIONS

There are no cross-references related to this application.

FIELD OF THE INVENTION

The present invention relates to a method for stacking chips and, more particularly, to a method for using resistance assistance for achieving alignment of stacked chips. Relevant potential applications for this invention include integrated circuit manufacturing processes.

BACKGROUND OF THE INVENTION

Currently, when manufacturing stacked or 3 D chips, a physical alignment process is used to align entire wafers. This can limit the number of good stacked chips that can be derived from the stacked wafers. This is due to the fact that the yielding parts would have to align spatially in order to get a functionally good stacked chip. Because individual chip alignment is not used, one cannot pick all of the good chips from one wafer and pair them up with all of the good chips from the other wafer (which would give you the maximum yield percentage). One also does not have the ability to stack parts based on power and perfomiance criteria. These issues are usually mitigated by putting a high yielding design on one of the stacked chips. This, however, limits the complexity of the design that can be placed on that chip.

It has been shown that the chips can be aligned by using magnetic forces. While this process works it has some disadvantages. Magnetic material must be used in the process. Additionally the magnetic force will only align the chips in the X and Y directions. It also does not guarantee good electrical connection because the magnetic force does not require well polished metal in order to work. Also while using the magnetic force to align the chips it is impossible to tell what direction to move the chip in order to get a stronger force.

SUMMARY OF THE INVENTION

This present invention will provide a method for aligning stacked chips on a single chip basis. Our method utilizes bumps in the form of exposed metal lines on a first chip and stacked and etched troughs lined with metal on a second chip. A resistance measurement will be taken to determine the quality of the alignment.

In one aspect of an embodiment of the present invention, the resistance measurement will also indicate the direction in which the chips are misaligned. These bumps and troughs can be used to physically align the two chips using a pattern on each chip.

In another aspect of an embodiment of the present invention, alignment and connectivity between the two chips are ensured by measuring the resistance between different sections of the two chips.

Additional aspects, objectives, and features of the present invention will become apparent from the following description of the preferred embodiments with reference to the attached drawings.

DETAILED DESCRIPTION OF THE INVENTION

The last metal in a chip stack is used to form the bumps on one of the chips using the following procedure. The last metal is deposited as usual, the photo resist is deposited and patterned, unneeded metal is removed, and the photo resist is stripped off. However, the additional oxide that is usually deposited with the last metal layer is not added. This is because for our process we desire there to be air where the oxide would normally be. This creates two types of bumps. One type of bump carries signals from one chip to another while the other types of bumps are used as alignment guides.

In a first aspect of an embodiment of the present invention, the bumps on the chip are placed in a pattern that fits the troughs. This pattern includes signal bumps as well as alignment bumps that fit in the larger alignment troughs. This allows physical alignment as well as signal transporting from one chip to the other. By depositing patterned oxide, exposing the through vias and etching a trough pattern creates troughs on the back side of the second chip. We also deposit metal in the troughs (using sputtering or a similar depositing technique) to ensure a connection to at least one through via in that trough. There is at least one electrical connection by through via in every trough.

Each through via connected to an alignment trough is connected by a lower metal level to another trough on the chip. This connection is then used to measure the resistance between the two troughs and determine whether the two chips are properly connected. A circuit is used to measure the resistance between the two chips. Once the resistance measurement is below a predefined threshold the chips are properly aligned and can be annealed together.

Figure 3:
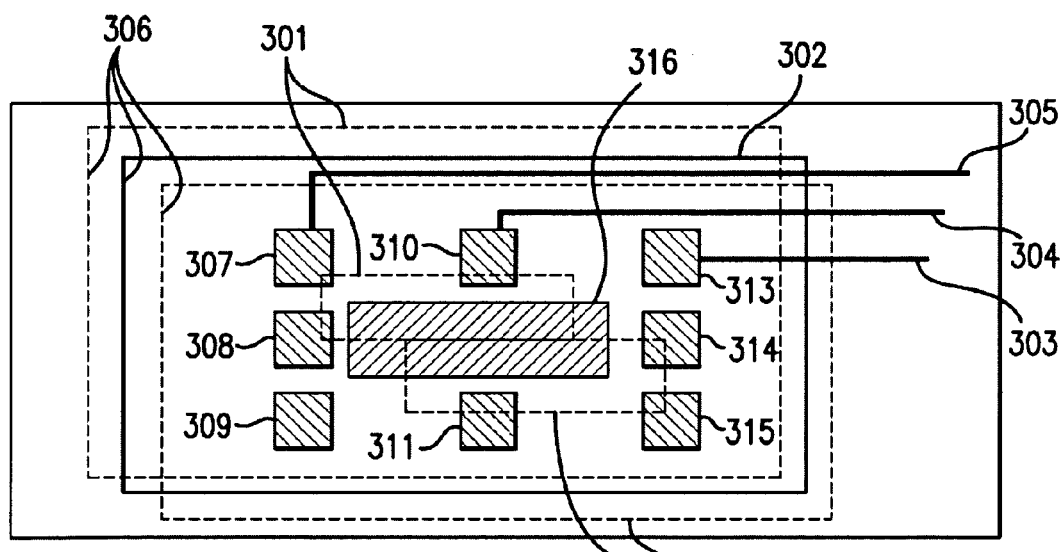
FIG. 3 illustrates a top down view of the two chips and illustrates examples of potential misalignment situations, in accordance with the embodiments of the present invention.

In the second aspect of an embodiment of this invention, a pattern of bumps fit inside a physically larger trough shown in FIG. 3. Once the bumps physically fall into the trough of the other chip, macro-alignment is completed. By measuring the resistance between the bumps and the metal in the trough, the alignment of the chips can be fine-tuned. Perfect alignment exists when the center bump is at a resistive minimum with the metal in the trough while the external bumps are at a resistive maximum. This in fact ensures that the center bump covers the metal in the trough completely while the external bumps do not touch the metal in the trough at all. Perfect alignment is then achieved.

The metal pad inside the trough is larger than the connecting bump. This pad needs to be large enough to not just cover the center bump but to also contact the surrounding bumps if the alignment is off. Any offset in the alignment is measured by changes in resistance in the other bumps. This not only shows the amount of the misalignment by having the resistance maximum change linearly with the misalignment but it also shows the direction by knowing the position of the output bump that sees a lower resistance. Given these two measurements an operator can determine what direction to move the chip as well as the approximate distance the move must be done.

The chips are kept in an inert environment during the alignment process. One chip is powered and held firm while the second chip sits above the first chip. Through agitation or deliberate movement the second chip is allowed to align and drop into place. Once the chip has dropped into place the resistance measurement drops below its threshold and alignment is complete.

Figure 1:
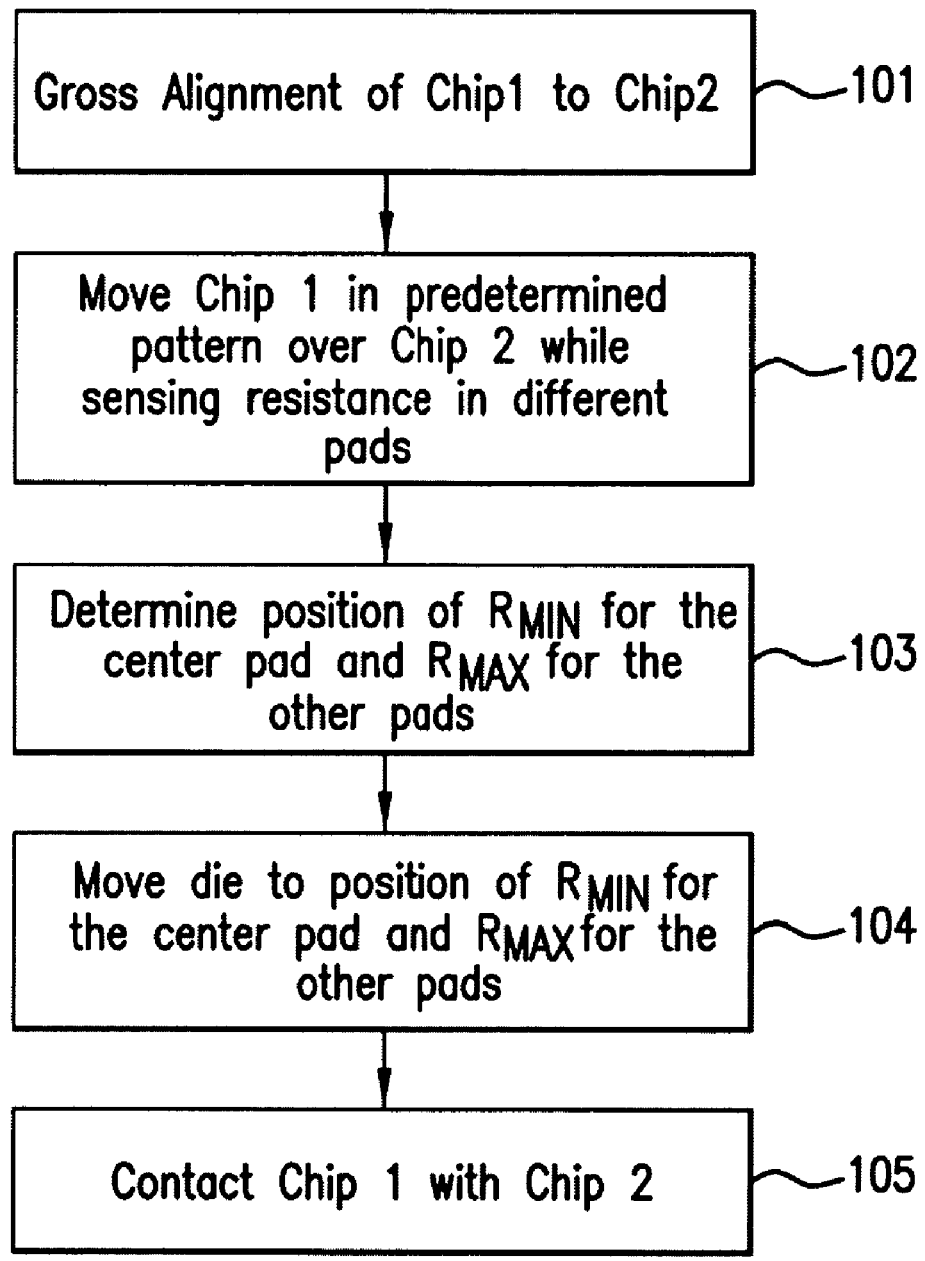
FIG. 1 illustrates an overview of a resistance assisted alignment process, in accordance with the embodiments of the present invention.

FIG. 1 illustrates an overview of a resistance assisted alignment process, in accordance with embodiments of the present invention. Reference 101 provides for a gross alignment of Chip 1 to Chip2. Reference numeral 102 provides for moving Chip 1 in a predetermined pattern over Chip2 while sensing resistance in different pads. Reference numeral 103 provides for determining the position of $R_{min}$ for the center pad and $R_{max}$ for the other pads. Reference numeral 104 represents moving a die to the position of R for the center pad and $R_{max}$ for the other pads. Reference numeral 105 represents providing for making contact between Chip 1 and Chip2.

Figure 2:
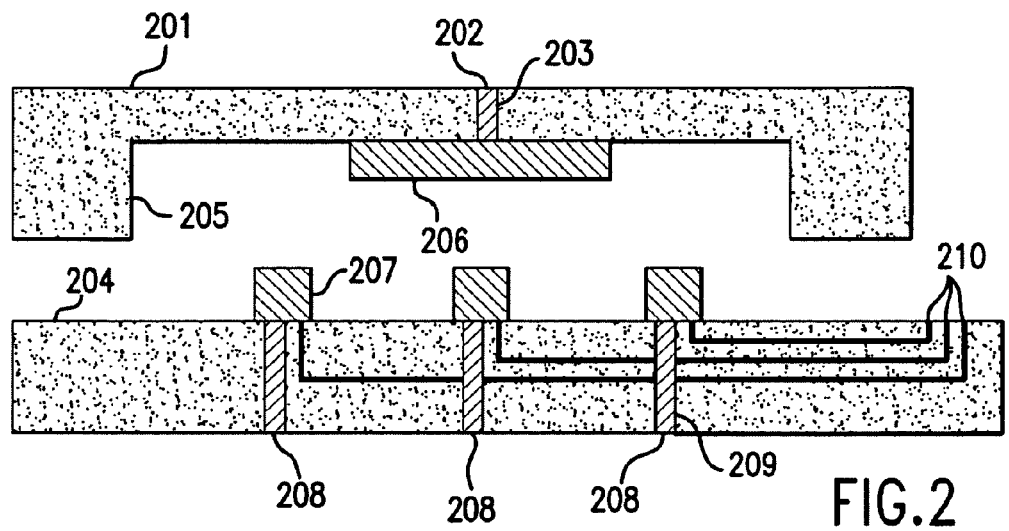
FIG. 2 illustrates a cross sectional side view illustrating an interconnection between the top chip and the bottom chip, in accordance with the embodiments of the present invention.

FIG. 2 illustrates a cross sectional side view illustrating an interconnection between the top chip and the bottom chip, in accordance with embodiments of the present invention. The backside/non-circuit side of the top chip 201 is connected to the frontside/circuit side of the bottom chip 204 through "through silicon vias" (TSV) 209. The macro-alignment utilizes a trough 205 to roughly position the bumps 206 and 207 within the trough 205 for the initial connection between the two chips 201 and 204. Fine-tuning is then accomplished through resistance measurements by connections between the GND 202 and the frontside contacts 210 for chips of different sizes or through additional TSV 209 located on the backside of the bottom chip 204 for chips of the same size.

FIG. 3 illustrates a top down view of the two chips and illustrates examples of potential misalignment situations, in accordance with embodiments of the present invention. More specifically, FIG. 3 bumps 307, 308, 309, 310, 311, 313, 314, and 315 represent the bumps on the bottom chip as shown by 207 in FIG. 2. The large rectangle 316 in the middle of FIG. 3 represents the metal bump on the top chip 206 shown in FIG. 2. The solid line, referenced with 302, depicts perfect alignment. The dashed line, referenced with 301, depicts a misalignment up and to the left where as the dashed line, referenced with 312, depicts a misalignment down and to the right. The three lines 306 further represent examples of the three different alignments of the trough edge.

In the first potential misalignment situation 301, the top chip 201 shown in FIG. 2 is misaligned up and to the left of the bottom chip 204 shown in FIG. 2. This is determined by performing a resistance measurement and seeing that bumps 307, 308 and 310 are at ground while bumps 309, 311, 313, 314 and 315 are open circuits. Bumps 307, 308 and 310 would be at ground because part of those bumps would be in contact with the large rectangular bump 301 on the top chip due to the misalignment.

In the second potential misalignment situation 312, the top chip 201 shown in FIG. 2 is misaligned down and to the right of the bottom chip 204 shown in FIG. 2. This is determined by performing a resistance measurement and seeing that bumps 311, 314, and 315 are at ground while bumps 307, 308, 309, 310 and 313 are open circuits. Bumps 311, 314 and 315 would be at ground because part of those bumps would be in contact with the large rectangular bump 312 on the top chip due to the misalignment.

After performing a resistance measurement 303, 304, 305 and looking at the results the direction in which the top chip needs to be moved in order to achieve perfect alignment 302 can be determined.

Figure 4:
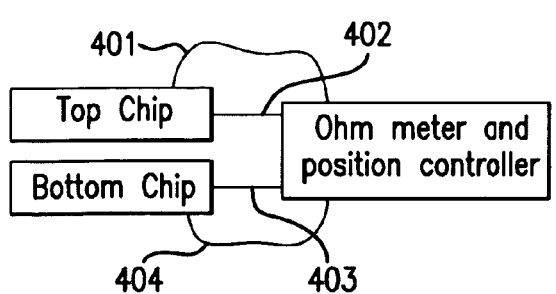
FIG. 4 illustrates an example arrangement used to adjust the alignment of the chips, in accordance with the embodiments of the present invention.

FIG. 4 illustrates an example arrangement used to adjust the alignment of the chips, in accordance with embodiments of the present invention. It is noted that an X/Y mechanical positioner could control only the top chip or the bottom chip instead of having two X/Y mechanical positioners as shown 402 and 403, with the other chip being in a "fixed position" during the positioning.

More specifically, FIG. 4 shows a potential set up that could be used to quantitatively determine the alignment of the chips. Using an ohm meter an initial resistance measurement 401 and 404 between the two chips would be made. This measurement will show the amount of the misalignment and will also show the direction of the misalignment. Based on this measurement, the chip(s) will be moved by the position controller into a position that is closer to perfect alignment. This process continues until the resistance measurement has dropped below its threshold and perfect alignment will be achieved.

Figure 5:
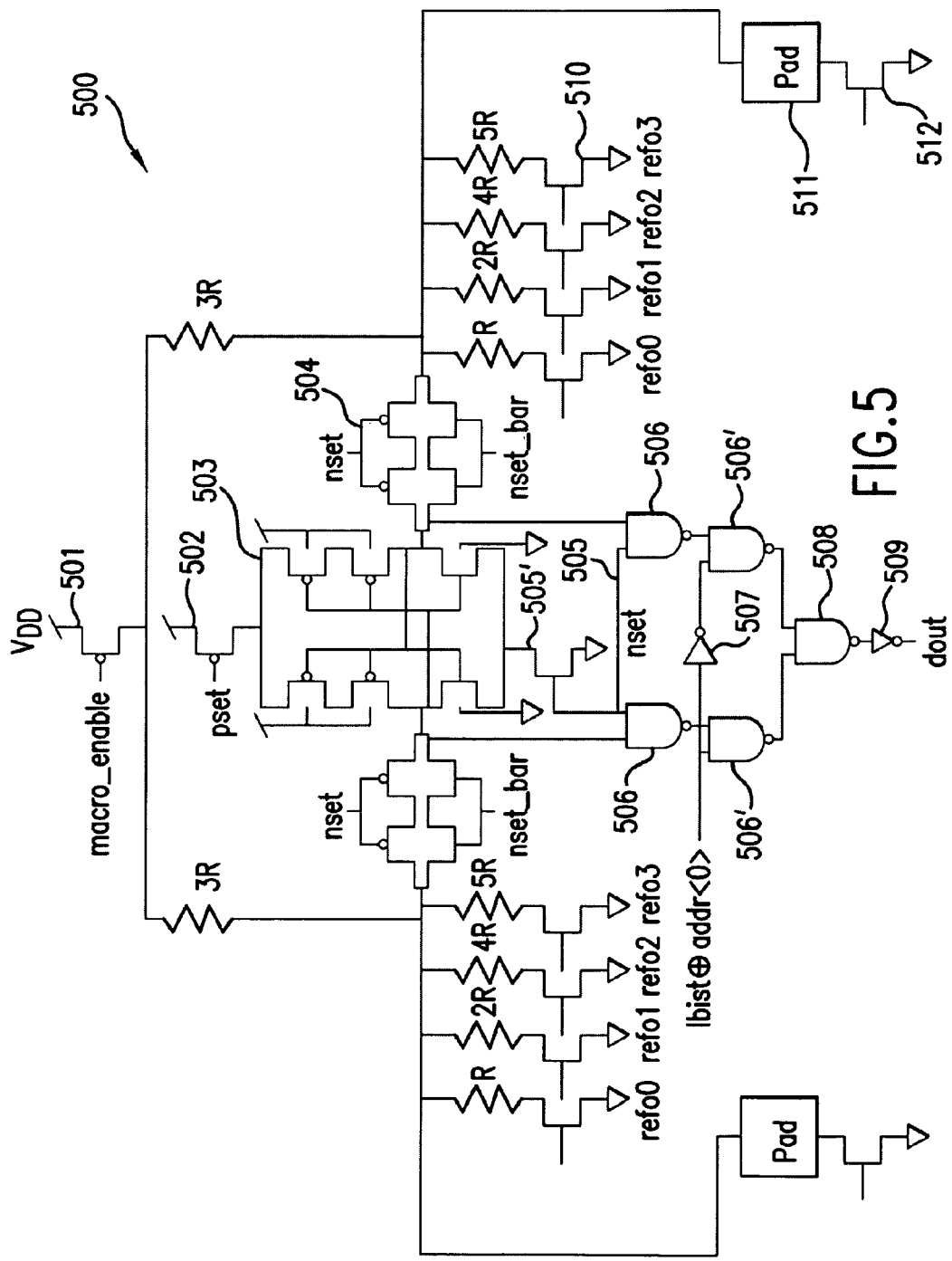
FIG. 5 illustrates a potential resistance measurement circuit, in accordance with the embodiments of the present invention.

FIG. 5 illustrates a potential resistance measurement circuit, in accordance with embodiments of the present invention. More specifically, FIG. 5 shows a balanced sense amplifier with a programmable reference in order to create a potential resistance measurement circuit.

Referring now to FIG. 5, a sense amplifier 500 is shown connected between the respective bitlines (not shown) at the connection points coupled to programmable reference resistors R, 2R, 4R, and 5R grounded by refo0, refo1, refo2, and ref03, respectively. A macro enable control signal macro_enable is generated with, for example, respective series connected PFETs and NFETs, is connected between the program voltage supply rail (not shown) and ground with cross connected gates of PFETs (not shown). The macro enable control signal macro_enable is applied to a gate input of a header PFET 501. The header PFET 368 is connected between the pull-up resistors 3R of the sense amplifier 500 and the voltage supply rail VDD.

The nset_bar signal applied to the respective transmission gate NFETs 504 on each side of 503 of the sensing circuit 500. The NSET signal is applied to the footer NFET 505' of the sense amplifier 500.

A data output DOUT of the sense amplifier 500 is provided with each side of 503 of the sensing circuit 500 providing an input to a NAND gate 506 The output of the NAND gate 506 is applied to an input of a NAND gate 506'. The respective outputs of NAND gates 506 are applied to a NAND gate 508. A string of at least one series connected inverters 509 are connected to the output of the NAND gate 382 providing the data output DOUT.

The PSET signal applied to the header PFET 502 of the sensing circuit 500 to provide a control signal.

A logic built in self test (LBIST) input signal lbist is coupled by a pair of series connected inverters 506' to an exclusive-OR gate 507, with an address signal ADDR <0>. The output of exclusive-OR gate 507 is applied to the second input of the NAND gate 506' on both sides of 503 of the sensing circuit 500. The input signal lbist is used to force an output multiplexer function of sense amplifier 500 into the compliment state. This allows the testing of all the down stream logic because both true and compliment states can be read. This also allows the testing of all upstream logic by forcing both states into the logic stream.

The pad, referenced by 511, represents the bumps on ether chip (as shown in FIG. 2 by 206 and 207). The transistor, referenced by 512, is a selection device used to select the pads between which you would like to measure the resistor.

The apparatus and methods of this invention have been described with respect to individual chips. However, this apparatus and methods of chip alignment may also be employed with a plurality of chips.

Further, the invention has been described in detail with particular reference to certain preferred embodiments thereof but it will be understood that variations and modifications can be effected within the spirit and scope of the invention.

The invention claimed is:

1. The method of aligning stacked chips comprising:
providing bumps in the form of exposed metal lines on a first chip;
providing stacked and etched troughs lined with metal on a second chip;
taking a resistance measurement between a different section of the first and second chip to determine the quality of alignment;
wherein the resistance measurement indicates a direction in which the first chip and the second chip are misaligned.

* * * * *